United States Patent [19]
Watt

[11] Patent Number: 5,784,242
[45] Date of Patent: *Jul. 21, 1998

[54] APPARATUS FOR SMART POWER SUPPLY ESD PROTECTION STRUCTURE

[75] Inventor: Jeffrey T. Watt, Mountain View, Calif.

[73] Assignee: Cypress Semiconductor Corp., San Jose, Calif.

[ * ] Notice: The term of this patent shall not extend beyond the expiration date of Pat. No. 5,625,522.

[21] Appl. No.: 758,336

[22] Filed: Dec. 3, 1996

Related U.S. Application Data

[63] Continuation of Ser. No. 297,629, Aug. 29, 1994, Pat. No. 5,625,522.

[51] Int. Cl.$^6$ .................................................. H02H 3/00
[52] U.S. Cl. ........................... 361/111; 361/56; 361/118
[58] Field of Search ............................. 361/56, 58, 91, 361/118, 119, 127, 115

[56] References Cited

U.S. PATENT DOCUMENTS

| | | | |
|---|---|---|---|
| 5,157,573 | 10/1992 | Lee et al. | 361/56 |
| 5,173,755 | 12/1992 | Co | 257/361 |
| 5,237,395 | 8/1993 | Lee | 257/358 |
| 5,264,723 | 11/1993 | Strauss | 257/532 |
| 5,444,400 | 8/1995 | Hall | 327/108 |
| 5,625,522 | 4/1997 | Watt | 361/111 |

OTHER PUBLICATIONS

T. Polgreen and A. Chatterjee, "Improving the ESD Failure Threshold of Silicided nMOS Output Transistors by Ensuring Uniform Current Flow", *1989 EOS/ESD Symposium Proceedings*, pp. 167–174, 1989.

Richard Merrill and Enayet Issaq, "ESD Design Methodology", *1993 EOS/ESD Symposium*, pp. 5B.5.1–5B.5.5, 1993.

Naresh Tandan, "ESD Trigger Circuit", *1994 EOS/ESD Symposium*, pp. 3.3.1–3.3.5, 1994.

Charvaka Duvvury, Robert N. Rountree and Olen Adams, "Internal Chip ESD Phenomena Beyond the Protection Circuit", *IEEE Transactions on Electron Devices*, vol. 35, No. 12, pp. 2133–2138, Dec. 1988.

Charvaka Duvvury, Carlos Diaz and Tim Haddock, "Achieving Uniform nMOS Device Power Distribution for Sub–micron ESD Reliability" *IEDM 92*, pp. 6.1.1–6.1.4, Apr. 1992.

Leo van Roozendaal et al., "Standard ESD Testing of Integrated Circuits", *EOS/ESD Symposium Proceedings*, pp. 119–130, 1990.

Amitava Chatterjee and Thomas Polgreen, "A Low–Voltage Triggering SCR for On–Chip ESD Protection at Output and Input Pads", *IEEE Electron Device Letters*, vol. 12, No. 1, pp. 21–22, Jan. 1991.

*Primary Examiner*—Jeffrey A. Gaffin
*Assistant Examiner*—Stephen Jackson
*Attorney, Agent, or Firm*—Blakely, Sokoloff, Taylor & Zafman LLP

[57] ABSTRACT

A protective circuit for protecting internal circuits of semiconductor integrated circuits (ICs) from ElectroStatic Discharges (ESD) into a voltage conduit of a semiconductor IC. The protective circuit is coupled in parallel with the internal circuit of the semiconductor IC such that the protective circuit and the internal circuit are each coupled to a first voltage conduit at a first reference voltage at one end and to a second voltage conduit at a second reference voltage at another end. The protective circuit includes an ESD protection device (or devices) for channeling an ESD discharge from the first voltage conduit through the protective circuit to the second voltage conduit. The protective circuit also includes a control circuit for turning "on" (e.g. operating in a low impedance state) the ESD protection device during the occurrence of the ESD discharge into the first voltage conduit. Furthermore, the control circuit turns "on" the ESD protection device before other devices in the internal circuit are damaged as a result of the ESD discharge. Therefore, by channeling the ESD discharge through the ESD protection circuit when an ESD discharge is recognized, but before other devices in the internal circuit are damaged, the ESD protection circuit prevents the internal circuit from being damaged during an ESD discharge.

15 Claims, 9 Drawing Sheets

APPARATUS FOR SMART POWER SUPPLY ESD PROTECTION STRUCTURE

This is a continuation of application Ser. No. 08/297,629, filed Aug. 29, 1994 now U.S. Pat. No. 5,025,522.

BACKGROUND

1. Field of the Invention

The invention relates to ElectroStatic Discharge (ESD) protection for semiconductor integrated circuits (IC).

2. Background of the Invention

Integrated circuits are particularly susceptible to Electro-Static Discharge (ESD). ESD discharges are generated by human contact, or when handling or bonding a circuit, or merely when the part is sliding around (for example when shipping the part). ESD discharge generated by human contact is modeled using the human body model described in MIL-STD 883C Method 3015.7.

ESD discharges find their way into an integrated circuit (IC) through the conductive pins (e.g. metal pins) which are connected to the pads of the IC through bond wires. In order to obtain complete immunity against transient ESD pulses, VLSI circuits must incorporate protection circuits at every input and I/O pin. The techniques for achieving this are fairly well established in the art. However, effective protection between the power supply pins are often overlooked although this is equally important for overall ESD immunity. A comprehensive method of testing requires not only the stressing of every pin with respect to $V_{DD}$ and $V_{ss}$, but also between inputs and outputs. (C. Duvvury, R. Rountree, and O. Adams, "Internal Chip ESD Phenomena Beyond the Protection Circuit", IEEE Transactions on Electron Devices, Vol. 35, No. 12, pp. 2133–2138).

The ways of protecting a semiconductor IC from an ESD discharge depend on the function of the pin, e.g., depending on whether the pin is for input, output, or input/output (I/O) or power supply. For example, in one prior art approach, a circuit is provided near the pad that works for input pins that must present high input impedance. The same circuit may not work for output pins, I/O pins or power supply pins. Note that ESD protection circuits are often implemented near each pad on an IC, but this positioning is not necessarily required particularly in the case of power supply pins/pads.

Figure 1:
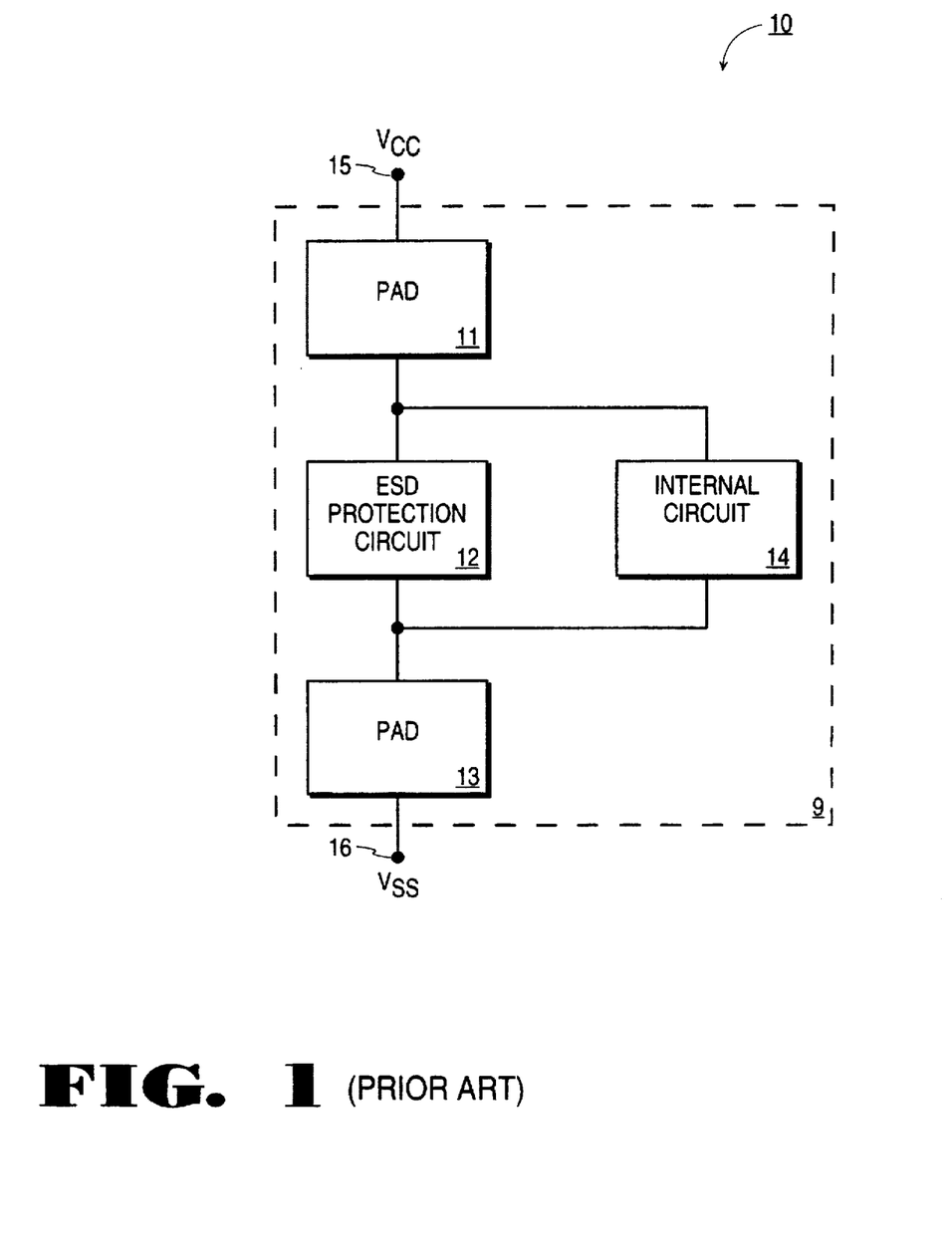
FIG. 1 illustrates a block diagram of a typical ESD protection structure for the power supply pins.

In a prevalent general design used to protect semiconductor ICs from ESD discharge into the power supply pins, as shown in FIG. 1, an ESD protection circuit 12 is interposed between a pad 11 on IC 9, where pad 11 is coupled to a first voltage conduit 15 at Vcc and a pad 13 on IC 9, where pad 13 is coupled to a second voltage conduit 16 at Vss. Pad 11 and Pad 13 are also connected to internal circuit 14 such that internal circuit 14 is connected in parallel to ESD protection circuit 12. Voltage conduits 15 and 16 can be any one of the ground, or the power supply, or either reference voltages applied to an IC, two of them are shown as Vcc and Vss conduits. The Vss conduit is usually maintained at 0V while the Vcc is usually maintained at 5V however, the scheme of FIG. 1 is not intended to be limiting, as ESDs could be channeled into voltage conduits other than those at Vss and Vcc which are supplying reference voltages to an IC during the normal operation of IC 9. The function of ESD protection circuit 12 is to channel the ESD discharge from voltage conduit 15 to voltage conduit 16, while not shorting out the path from pad 11 to pad 13 when the semiconductor is powered "on" during normal semiconductor IC operation. Moreover, the ESD protection circuit must channel an ESD discharge even when the IC is powered "off" such as during ESD testing according to MIL-STD 883C Method 3015.7. It will be appreciated that pads 11 and 13 and circuits 12 and 14 are part of IC 9.

Figure 2:
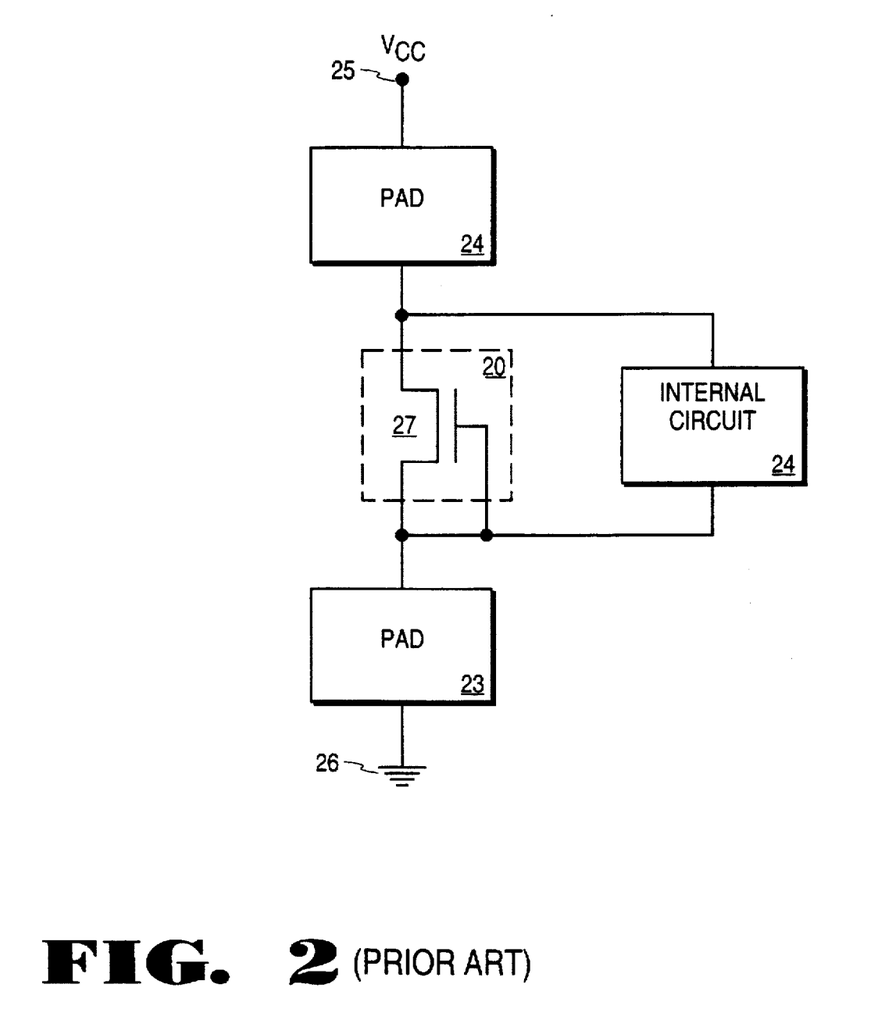
FIG. 2 illustrates a prior art ESD protection structure utilizing a MOS transistor.

The generic ESD protection circuit 10 in FIG. 1 has been utilized in the prior art. As seen in FIG. 2, an ESD protection circuit 20 is interposed between pad 21 and pad 23 such that during an ESD discharge coming from a first voltage conduit 25 at Vcc during normal operation of the semiconductor IC when the semiconductor IC is powered "on", the current is channeled through ESD protection circuit 20 comprising an N-channel MOS transistor 27 having a gate and a drain coupled to a second voltage conduit 26, at ground, rather than being channeled through internal circuit 24. Furthermore, the current from an ESD discharge coming from a first voltage conduit 25 is also channeled through ESD protection circuit 20 when the semiconductor IC is powered "off" such that voltage conduit 25 at Vcc is floating.

When ESD protection circuit 20 is not responding to an ESD discharge channeled through voltage conduit 25, ESD protection circuit 20 is turned "off" (e.g. held in a high impedance state) such that current does not flow from the drain to a source of MOS transistor 27. But, during ESD discharge, the voltage across the drain and the source of MOS transistor 27 approaches its breakdown voltage such that MOS transistor 27 gets turned "on" (e.g. triggered into a low impedance state). When ESD protection circuit is turned "on", a sufficient amount of current flows from the drain to the source of MOS transistor 27.

Figure 5:
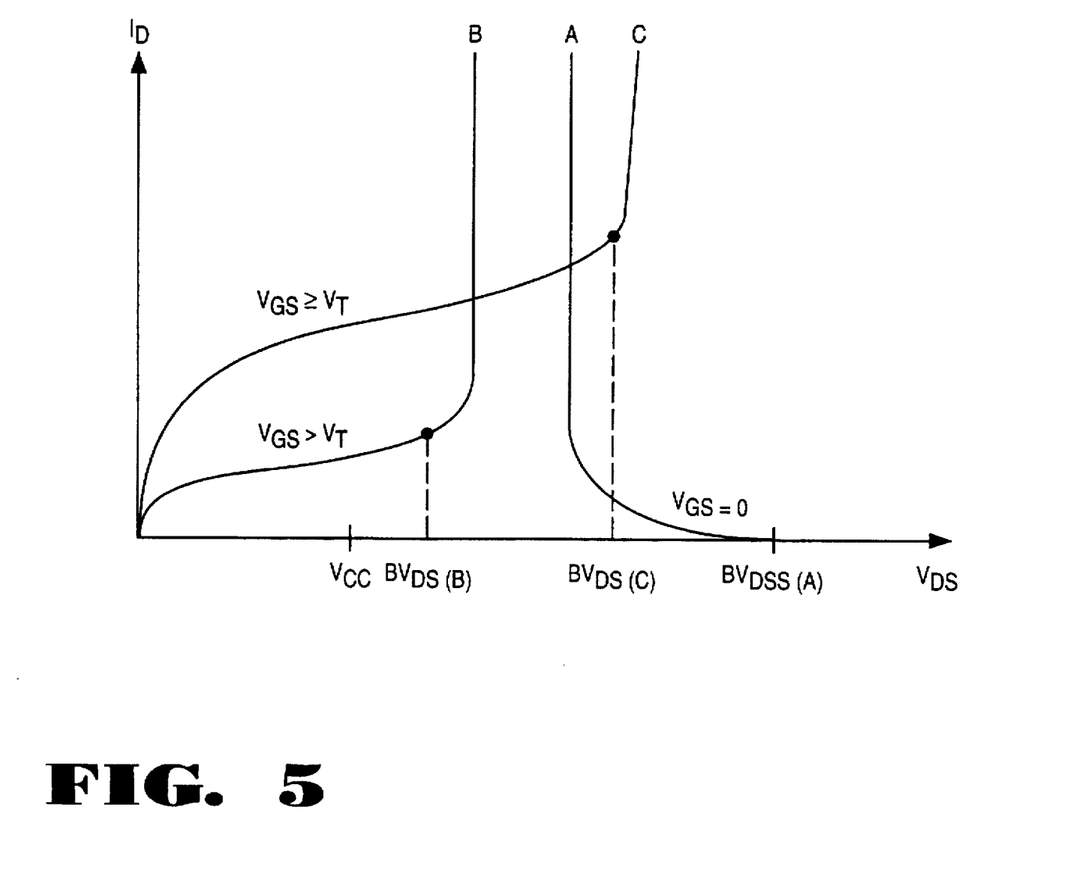
FIG. 5 is the characteristic i-v curve of an N-channel MOS transistor in the preferred embodiment.

As shown in FIG. 5, curve A illustrates a MOS transistor with a voltage across a gate and a source equal to 0V, such as MOS transistor 27 in ESD protection circuit 20. According to FIG. 5, the vertical axis represents the current flowing from a drain to the source ($I_D$) of the MOS transistor and the horizontal axis represents the voltage across the drain and the source ($V_{DS}$) of the MOS transistor. As $V_{DS}$ of MOS transistor 27 approaches its breakdown voltage ($BV_{DSS(A)}$), MOS transistor 27 has negligible current, approximately 0 mA, flowing from the drain to the source of MOS transistor 27 shown by the horizontal portion of curve A. Once MOS transistor 27 reaches its $BV_{DSS(A)}$, $V_{DS}$ of MOS transistor 27 "snaps back" to a holding voltage ($V_H$) of MOS transistor 27. While MOS transistor 27 is maintained at $V_H$, MOS transistor 27 operates in its low impedance state, operating as a short circuit to allow $I_D$ to flow through ESD protection circuit 20 (thereby discharging the ESD which is causing the current $I_D$).

Figure 7:
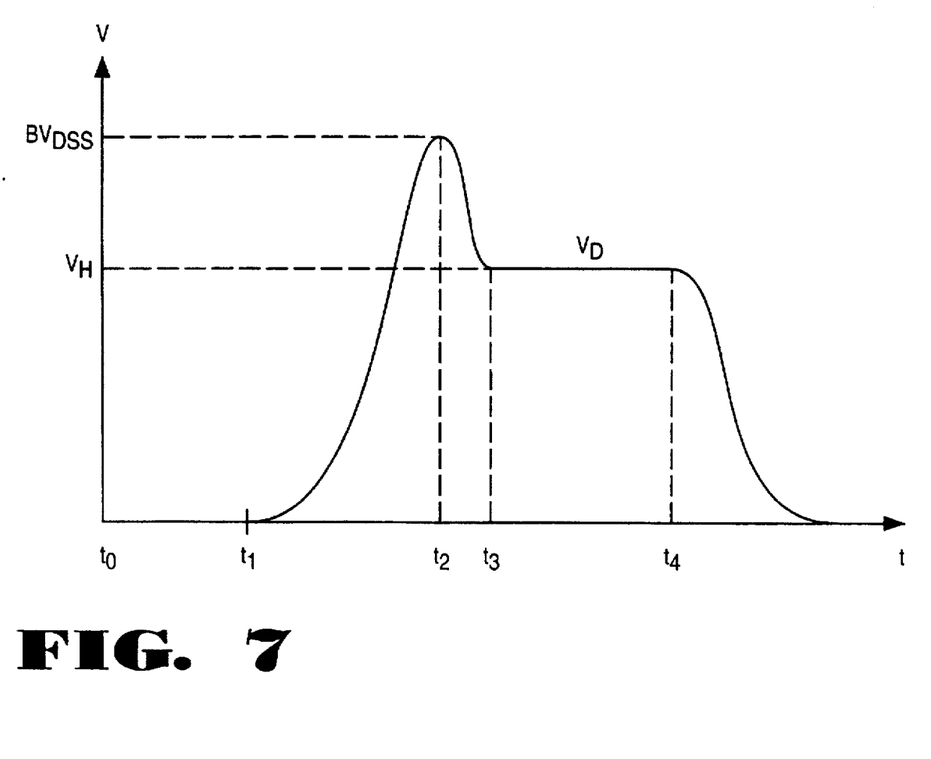
FIG. 7 illustrates the voltage waveform of the prior art.

The waveform of $V_{DS}$ of MOS transistor 27 in ESD protection circuit 20 is shown in FIG. 7. Curve $V_D$ represents the voltage across the drain and the source of the MOS transistor with the drain coupled to Vcc and the source coupled to ground. At $t_0$, MOS transistor 27 is operating in the high impedance state while internal circuit 24 is operating under normal conditions, or more likely, voltage conduit 25 at Vcc is floating until it is "zapped" by an ESD discharge. However, the increase in $V_D$ starting at $t_1$ represents the start of the ESD discharge through the first voltage conduit. At $t_2$, the MOS transistor reaches $BV_{DSS}$ which causes $V_D$ to "snap back" to $V_H$ at $t_3$ which is maintained until $t_4$, at which point $V_D$ starts to decline when the ESD charge has been dissipated and MOS transistor 27 is no longer responding to the ESD discharge from the first voltage conduit.

Thus, the ESD protection device 27 controls its own operation (i.e. it is self controlling) and this self-control has been viewed as beneficial; however, this self-control has an unrecognized disadvantage. The disadvantage of allowing MOS transistor 27 to approach $BV_{DSS}$ (approximately 13V in this embodiment) before snapping back to $V_H$ (approximately 7-8V in this embodiment), is that parasitic devices directly connected across Vcc and Vss may be activated before the "snap back" is triggered at about 13V. Once the parasitic devices are activated, they start dissipating the ESD discharge and are most likely damaged before MOS transistor 27 turns "on" to channel the ESD charge through MOS transistor 27. Examples of this damage are shown in the Duvvury reference cited.

Therefore, it is desirable to provide the ESD protection circuit 12 that operates in the low impedance state (e.g. turns "on") before the parasitic devices connected across the voltage conduits are damaged. This can be accomplished by channeling the ESD discharge through ESD protection circuit 12 before approaching the break down of the parasitic devices. In order for this to occur, the breakdown voltage of the MOS transistor must be reduced to be close to the holding voltage of the MOS transistor. The present invention provides an improved ESD protection circuit 12 that is activated upon sensing an ESD discharge and is triggered smoothly into its low impedance state before the parasitic devices are damaged.

SUMMARY OF THE INVENTION

It is desirable to provide an improved apparatus that channels the ESD discharge through the ESD protection circuit before other parasitic devices connected across the voltage conduits are damaged.

It is also desirable to provide an ESD protection device that operates in a high impedance state during normal operation when the semiconductor IC is powered "on" or when the voltage conduit is floating when the semiconductor IC is powered "off" and is triggered into a low impedance state during an ESD discharge without any substantial "snap back" effect.

In an embodiment of the present invention, the ESD protection circuit comprises an ESD protection device coupled to a control circuit such that when the control circuit senses a beginning of the ESD discharge into the first voltage conduit, the control circuit turns "on" the ESD protection circuit such that the current is channeled through the ESD protection device to be dissipated through the second voltage conduit. Once the ESD discharge coming from the first voltage conduit has ended, ESD protection device no longer channels current through it. After the occurrence of the ESD discharge on a semiconductor IC which is powered "on", the current coming from the first voltage conduit is once again channeled through the internal circuit of the semiconductor IC.

In the absence of the control circuit to sense the beginning of the ESD discharge, the ESD protection device may not turn "on" before other devices connected across the first and second voltage conduits approach their break down. When this happens, the other devices connected across the first and second voltage conduits are activated before the ESD protection device turns "on", thereby starting to dissipate the ESD discharge coming from the first power supply which may lead to their break down. The present invention guarantees that the ESD protection device turns "on" before the other devices connected across the first and second voltage conduits approach their breakdown. A feature of the control circuit is to smoothly trigger the ESD protection device into its low impedance state which is maintained at a holding voltage, without any substantial "snap back" effect. The control circuit accomplishes this task by ensuring the breakdown voltage of the ESD protection device has a value that is close in value to the holding voltage of the ESD protection device and a lower value than the breakdown voltage of other devices connected across the first and second voltage conduits.

BRIEF DESCRIPTION OF THE DRAWINGS

The objects, features and advantages of the present invention will become apparent to one skilled in the art from reading the following detailed description in which.

DETAILED DESCRIPTION OF THE INVENTION

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention unnecessarily.

The present invention discloses a protective circuit for protecting an internal circuit in a semiconductor integrated circuit (IC) from being damaged during an ESD discharge. More specifically, this invention is used to protect the internal circuitry of a semiconductor IC from the ESD discharge into the voltage conduits of the semiconductor IC.

Typically, an internal circuit is damaged when the ESD discharge is channeled through an input, output, input/output (I/O), or power supply pins of the semiconductor IC to the internal circuitry of the semiconductor IC. Since the ESD discharge temporarily increases a voltage coming from one of the voltage conduits over a short period of time, thereby causing devices in the internal circuitry to break down, the internal circuitry of the semiconductor IC may be damaged during the ESD discharge. In order to protect the internal circuitry from the ESD discharge into the power supply pins, an ESD protection circuit is used to channel the ESD discharge coming from a first voltage conduit (typically Vcc) through the ESD protection device coupled to a second voltage conduit (typically Vss or ground). However, the ESD discharge must be channeled before other devices connected across the voltage conduits are damaged.

Therefore, it is desirable to provide an ESD protection circuit that turns "on" before other devices in the internal circuitry are activated and damaged.

Figure 3:
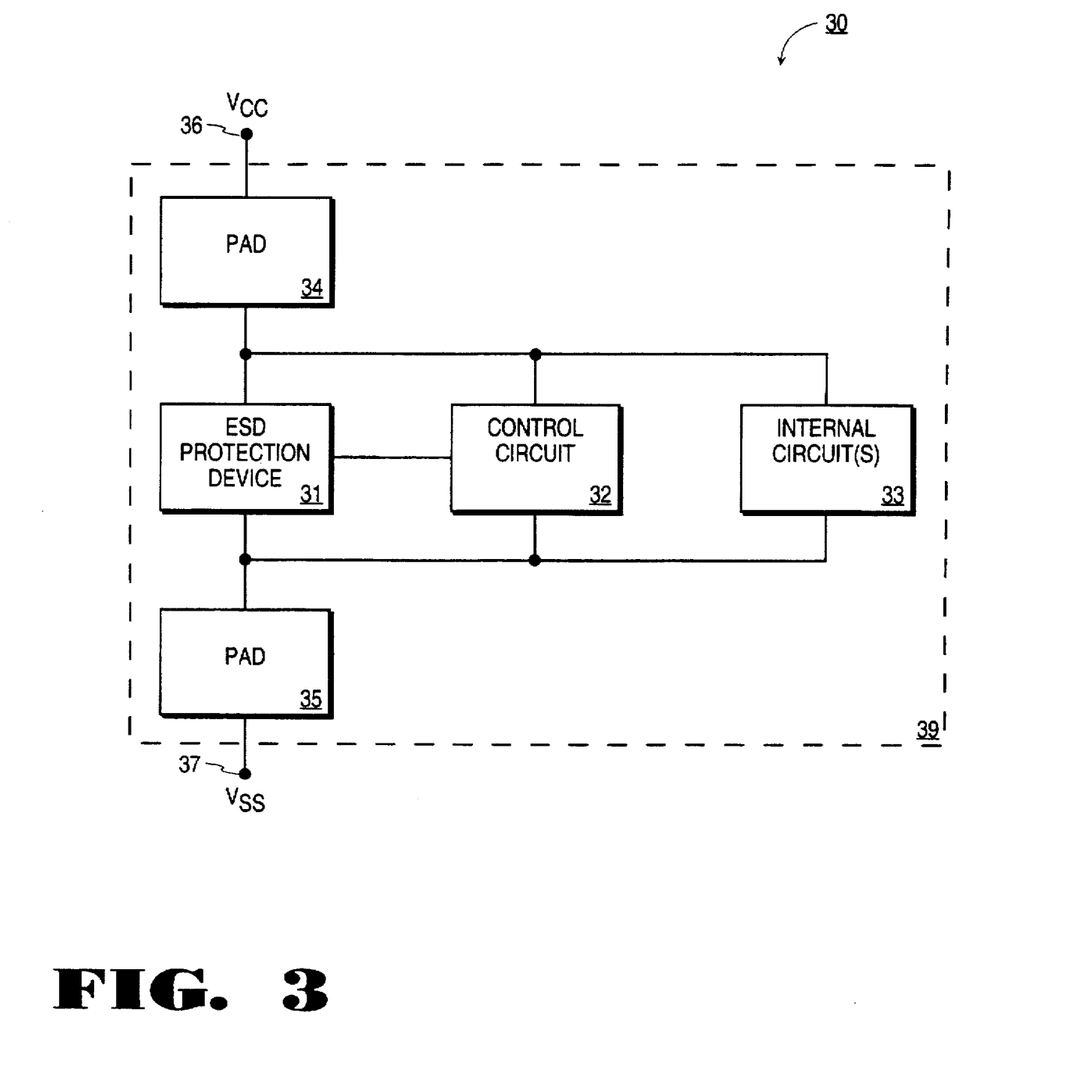
FIG. 3 illustrates a block diagram of the present invention.

According to FIG. 3, ESD protective circuit includes ESD protection device 31 and control circuit 32 coupled in parallel. Furthermore, internal circuit 33 of the semiconductor IC 39 is coupled in parallel with ESD protective circuit 12 such that internal circuit 33, ESD protection device 31 and control circuit 32 are all on IC 39 and coupled in parallel with one end coupled to a first voltage conduit 36 at Vcc through pad 34 and a second end coupled to a second voltage conduit 37 at Vss through pad 35.

Therefore, when control circuit 32 recognizes the characteristic i-v behavior of the ESD discharge, ESD protection device 31 is turned "on" by control circuit 32 such that the current coming from voltage conduit 36 is channeled through ESD protection device 31 to voltage conduit 37 thereby preventing the internal circuit 33 from being damaged or "zapped" by the ESD discharge.

Although the prior art channels the ESD discharge through ESD protective circuit 12, it does not have the capability to turn "on" protective circuit 12 before the other devices connected across the voltage conduits are activated by the ESD discharge. Therefore, an advantage of the present invention is to channel the current coming from the ESD discharge before the other devices connected across the voltage conduits are damaged by dissipating the current from the ESD discharge.

One embodiment of the present invention accomplishes this task by having control circuit 32 control the operation of ESD protection device 31 which may comprise an N-channel MOS transistor. The main function of control circuit 32 is to sense or recognize the occurrence of the ESD event such that ESD protective circuit 12 is maintained at a high impedance state (e.g. turned "off") when the semiconductor IC is powered "on" or when voltage conduit 36 is left floating when the semiconductor IC is powered "off" and is triggered into a low impedance state (e.g. turned "on") when the ESD discharge is sensed by control circuit 32.

When the semiconductor IC is powered "on" and is operating under normal conditions, internal circuit 33 is driven by the first and second reference voltages coming from the voltage conduits. During this time, ESD protective device 31, operating in the high impedance state, prevents current from flowing through the ESD protective device 31 to ensure that the current generated from the voltage conduits are channeled through to internal circuit 33. Furthermore, when the semiconductor IC is powered "off", the ESD protection device also operates in the high impedance state.

Figure 4:
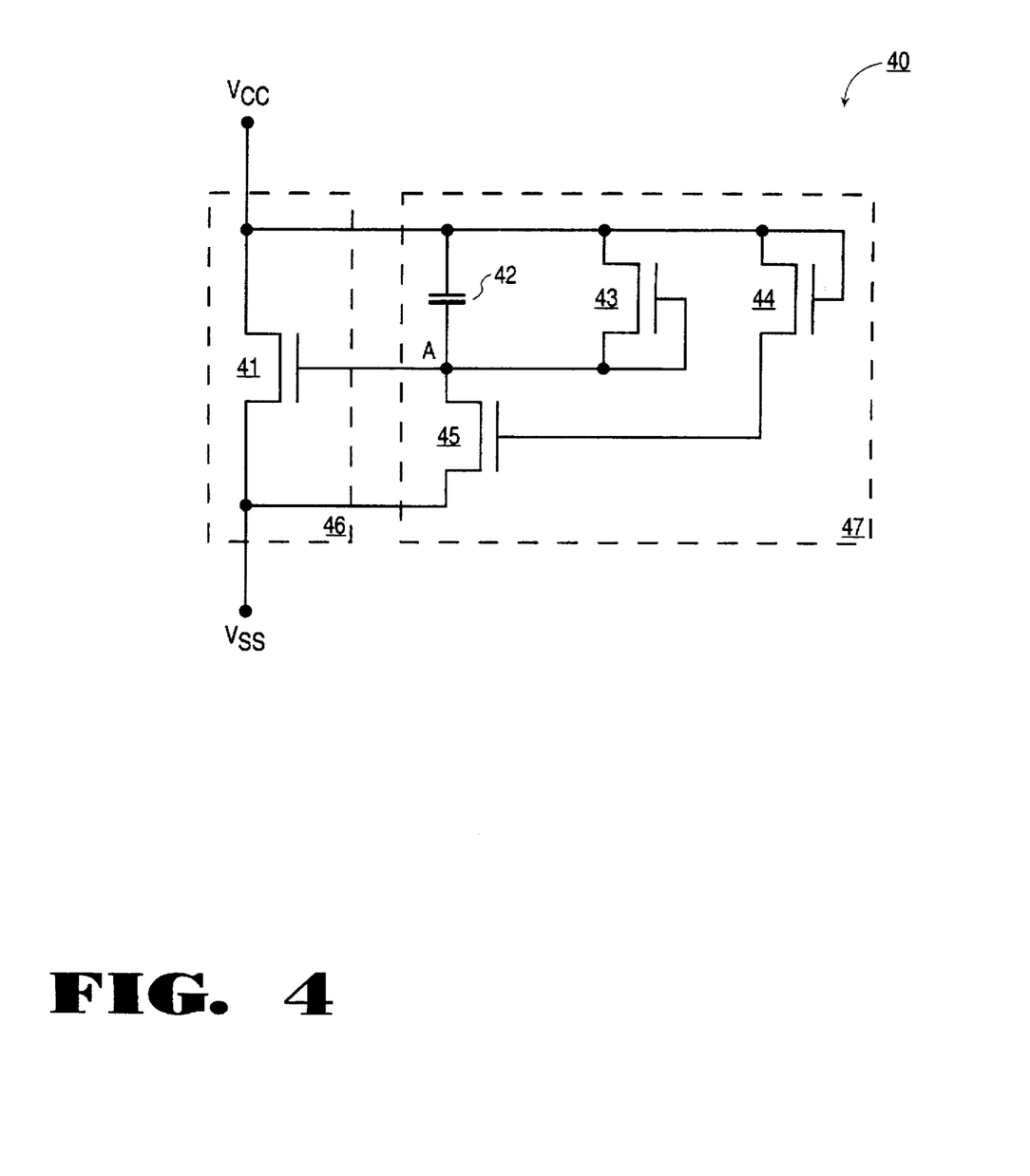
FIG. 4 is a detailed drawing of a preferred embodiment of the present invention.

On the other hand, when the ESD discharge occurs, control circuit 32 increases an input voltage to ESD protection device 31, which according to preferred embodiment 40 in FIG. 4 are boxes 47 and 46 respectively, such that control circuit 47 is coupled to a gate voltage of MOS transistor 41 at node A. This increase in the gate voltage of MOS transistor 41 activates MOS transistor 41 such that MOS transistor 41 gets triggered into its low impedance state thereby allowing a significant amount of current from the ESD discharge to flow from a drain of MOS transistor 41 to a source of MOS transistor 41 through ESD protective device 46. By activating MOS transistor 41, MOS transistor 41 is triggered into its low impedance state (at approximately 7-8V) before ever reaching its breakdown voltage (at approximately 13V).

According to FIG. 5 in which the vertical axis represents a current flowing from a drain to a source of a MOS transistor $I_D$ and the horizontal axis represents a voltage across the drain and the source of the MOS transistor $V_{DS}$. Curve A illustrates the i-v characteristics of MOS transistor 41 when a voltage across the gate and the source $V_{GS}$ of MOS transistor 41 is equal to 0V. Note that $V_{GS}$ of MOS transistor 41 is maintained at 0V when no ESD discharge from the first voltage conduit is sensed by control circuit 32 in the present invention or if an ESD protection circuit such as ESD protection circuit 20 is used (see prior art discussion).

In this situation, $I_D$ flowing through MOS transistor 41 is 0V until a breakdown voltage $BV_{DSS(A)}$ of MOS transistor 41 is reached. At this point, $V_{DS}$ of MOS transistor 41 "snaps back" to a holding voltage $V_H$ and MOS transistor 41 has been triggered into its low impedance state, illustrated by the vertical portion of curve A. Once MOS transistor 41 is operating in its low impedance state, MOS transistor 41 has turned "on" such that a significant amount of $I_D$ may flow through MOS transistor 41. The advantage of the present invention is that MOS transistor 41 follows curve A until the ESD discharge is sensed. At that point, the gate voltage of MOS transistor 41 is increased such that the present invention has a response similar to curves B and C and never reaches $B_{VDSS(A)}$.

If $V_{GS}$ of MOS transistor 41 is above a threshold voltage $V_T$ of the MOS transistor 41, then curves B and C illustrate the i-v characteristics of MOS transistor 41. In order for this to occur, MOS transistor must be activated by control circuit 32. Note that as $V_{GS}$ of MOS transistor 41 increases above the $V_T$ of MOS transistor 41, the breakdown voltage $BV_{DS}$ and the holding voltage $V_H$ of the MOS transistor 41 increases (e.g. shifts to the right in the graph shown in FIG. 5). Furthermore, note that curves B and C are smoothly triggered into its low impedance state without any "snap back" effect. In other words, MOS transistor 41 approaches its breakdown voltage which is at a value that is lower than its holding voltage. It is typical in this embodiment to have a breakdown voltage which has a lower value than its holding voltage, however, it is sufficient to have a breakdown voltage that has a value close to the holding voltage. In other words, MOS transistor 41 can be smoothly triggered into its low impedance state even when there is a slight "snap back" effect.

This feature of MOS transistor 41 is desirable from the standpoint of preventing other devices connected across the voltage conduits from approaching their break down and causing them to get damaged before MOS transistor 41 is triggered into its low impedance state. Therefore, it is desirable to provide control circuit 47 that maintains $V_{GS}$ at 0V (such that MOS transistor 41 is turned "off") during normal operation of the semiconductor IC or when the semiconductor IC is powered "off", but as soon as control circuit 47 senses an ESD event, control circuit 47 starts to increase $V_{GS}$ of MOS transistor 41, thereby activating MOS transistor 41 and once $V_{GS}$ exceeds $V_T$ of MOS transistor 41 to smoothly trigger MOS transistor 41 into its low impedance state (such that MOS transistor 41 is turned "on") by having $V_H$ and $BV_{DS}$ being close in value (as illustrated in curves B and C).

FIG. 4 illustrates an implementation of the present invention with ESD protection device 46 including N-channel MOS transistor 41 and control circuit 47 including N-channel MOS capacitor 42 and N-channel MOS transistors 43, 44 and 45. According to FIG. 4, MOS transistor 41 has the drain coupled to a first voltage conduit 46 at Vcc during normal operation of the semiconductor IC and the source coupled to a second voltage conduit at Vss during normal operation of the semiconductor IC and the gate coupled to an output of control circuit 32 at node A. Typically, Vcc is at 5V and Vss is at 0V or ground. However, Vcc and Vss are not limited to the values mentioned above. MOS capacitor 42 has a gate coupled to Vcc and a drain/source coupled to a source and a gate of MOS transistor 43 and a drain of MOS transistor 45 which is also coupled to the output of control circuit 32 at node A. Furthermore, a drain of MOS transistor 43 and a drain and a gate of MOS transistor 44 are both coupled to Vcc and a source of MOS transistor 45 is coupled to Vss. MOS transistor 44 also has a source coupled to a gate of MOS transistor 45.

The occurrence of the ESD discharge channels a current surge through Vcc thereby increasing the gate voltage of MOS capacitor 42 and the drain voltage of MOS transistor 43. Once $V_{GS}$ of MOS capacitor 42 exceeds $V_T$ of MOS capacitor 42, MOS capacitor 42 tracks the voltage at the drain of MOS transistor 41 and couples charge onto the gate of MOS transistor 41. In order to prevent MOS capacitor 42 from burning out, MOS transistor 43 clamps a voltage across capacitor 42 when MOS transistor 43 is activated. Since the gate and the source of MOS transistor 43 are coupled together such that $V_{GS}=0V$, MOS transistor 43 must reach its breakdown voltage before being triggered into its low impedance state in order to clamp the voltage across capacitor 42.

Meanwhile, the current surge through Vcc also increases $V_{GS}$ of MOS transistor 44 such that when $V_{GS}$ of MOS transistor 44 exceeds $V_T$ of MOS transistor 44, MOS transistor 44 is activated and allows $I_D$ to flow through MOS transistor 44 increasing the gate voltage of MOS transistor 45. Once the $V_{GS}$ of MOS transistor 45 exceeds $V_T$ of MOS transistor 45, MOS transistor 45 is activated drawing current from node A. Therefore, while MOS capacitor 42 is attempting to increase $V_{GS}$ of MOS transistor 41 in order to trigger MOS transistor 41 into its low impedance state, MOS transistor 45 is attempting to decrease $V_{GS}$ of MOS transistor 41 so that once the ESD discharge has ended, ESD protection device 41 stops channeling the current coming from voltage conduit 46.

Figure 6:
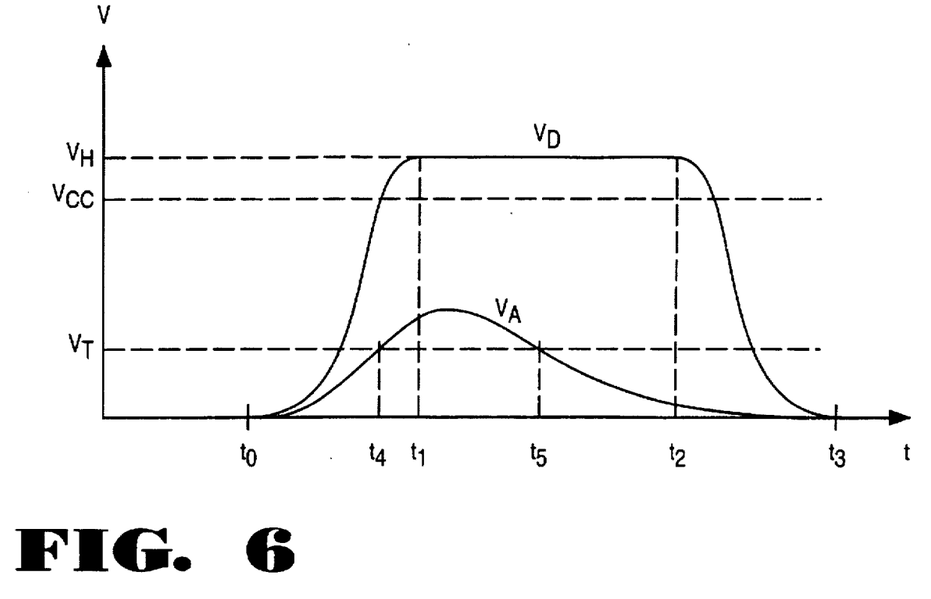
FIG. 6 illustrates the voltage waveform of the present invention.

This contention at node A generates the voltage waveforms in FIG. 6 with curve $V_D$ representing $V_{DS}$ of MOS transistor 41 and curve $V_A$ representing $V_{GS}$ of MOS transistor 41 located at node A. During an ESD discharge, a drain voltage of MOS transistor 41, tracks the ESD discharge. In other words, $V_D$ represents the voltage applied to the drain of MOS transistor 41 during an ESD discharge. Starting at $t_0$, control circuit 47 starts sensing the ESD discharge thus activating MOS transistor 41 in ESD protection circuit 46 once $V_{GS}$ exceeds $V_T$, such that at $t_1$, MOS transistor 41 is smoothly triggered into its low impedance state after reaching its breakdown voltage $BV_{DS}$ and is maintained at its holding voltage $V_H$ (approximately 7–8 V) which is illustrated by a horizontal portion of curve $V_D$, until $t_2$. Note that $V_D$ approaches $V_H$, after exceeding Vcc and $V_A$ exceeds $V_T$ of MOS transistor 41. Note that MOS transistor 41 continues to channel the current from the first voltage conduit until all the ESD discharge is dissipated at $t_3$ even though $V_A$ falls below $V_T$ at $t_5$ thereby turning "off" MOS transistor 41.

When comparing FIG. 6 illustrating the present invention shown in FIG. 4, and FIG. 7 illustrating the prior art shown in FIG. 2, MOS transistors 20 in the prior art is not triggered into its low impedance state until $t_3$, that is after approaching its breakdown voltage $BV_{DSS}$ of about 13V before being maintained at about 7–8 V until $t_4$. Unfortunately, before $V_H$ is reached at $t_3$, other devices connected across the voltage conduits may be damaged.

Referring back to FIG. 6, curve $V_A$ illustrates $V_{GS}$ of MOS transistor 41 at node A. As mentioned above, control circuit 32 controls the voltage at node A by pulling up the voltage at node A when an ESD discharge is sensed. At $t_0$, control circuit 32 recognizes the ESD event and starts to increase the voltage at node A and at $t_4$, after $V_T$ of MOS transistor 41 is approached, MOS transistor 41 is activated allowing $I_D$ to flow from the drain to the source of MOS transistor 41. At this point, control circuit 32 causes MOS transistor 41 to clamp $V_D$ at the $V_H$ of MOS transistor 41. Note that $V_D$ remains clamped even when the voltage at node A drops below $V_T$ as charge at the gate of MOS transistor 41 is discharged through MOS transistor 45. Therefore, MOS transistor 41 is only activated during the portion of curve $V_A$ above $V_T$ between $t_4$ and $t_5$ in response to the ESD discharge such that it may be smoothly triggered into its low impedance state during this time.

The critical parameters in the present invention are the sizes of MOS capacitor 42 and MOS transistors 41, 44 and 45. The channel length of MOS transistor 41 is used to optimize the voltage at which ESD protection circuit 12 clamps (e.g. maintains its holding voltage) and the channel width of MOS transistor 41 controls the ESD voltage which can be safely discharged. Furthermore, the ratio of the width-to-length (W/L) of MOS transistors 41, 44 and 45 and the area (width×length) of MOS capacitor 42 are adjusted to optimize the risetime of the Vcc voltage to which ESD protection circuit 12 will respond.

The width-to-length (W/L) ratio is measured as shown in FIG. 2.8 of page 40 of "Principles of CMOS VLSI Design" by Neil H. E. Weste and Kamran Eshraghian (Addison-Wesley Publishing Co., 1985), where length (L) is the distance the majority charge carriers move in going from the source to the drain in the channel region. In an embodiment of the invention, the W/L ratio of each MOS device 41, 42, 43, 44 and 45 is 92.7/0.7, 79.9/5.0, 5.0/0.7, 5.0/0.7 and 0.7/87.7, respectively.

Figure 8:
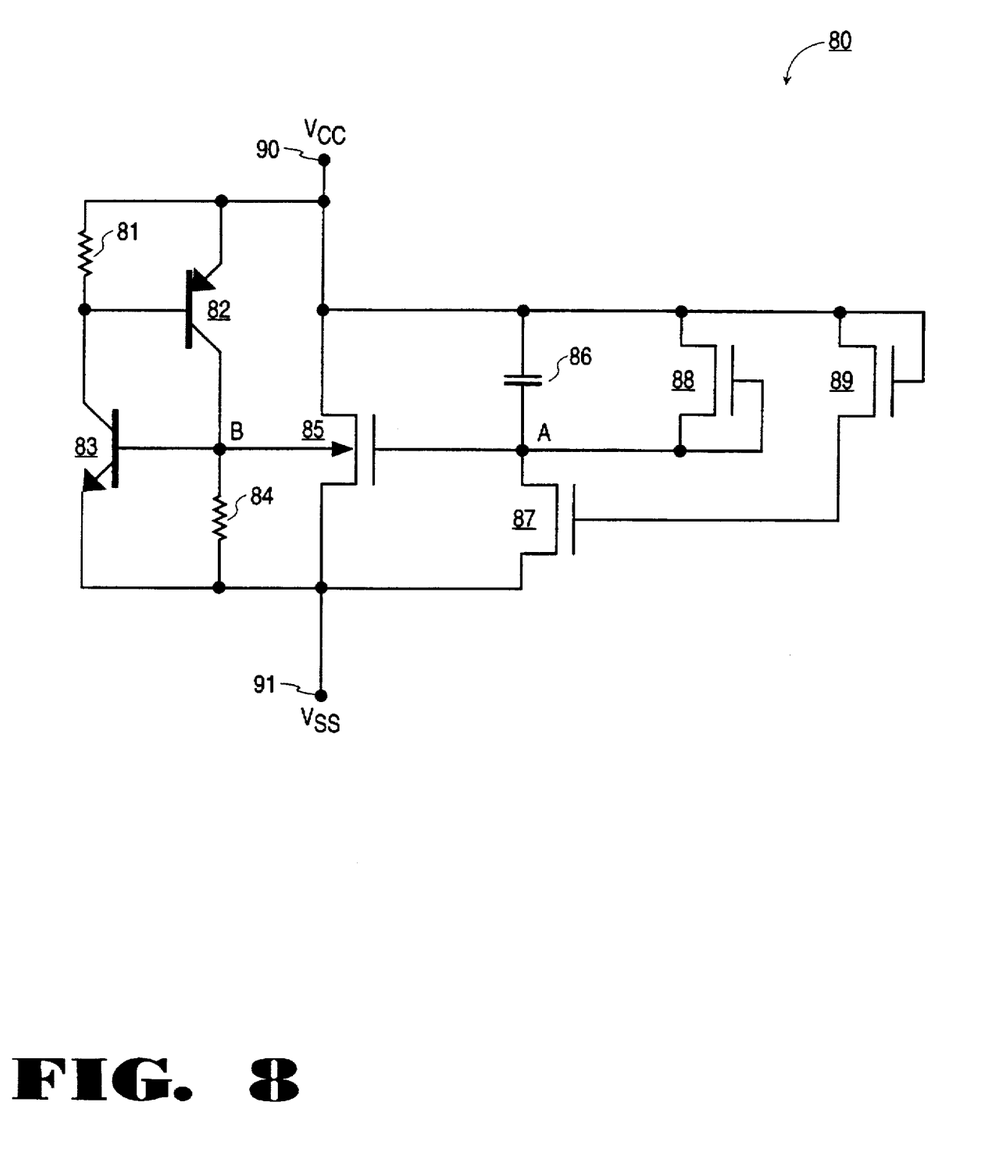
FIG. 8 is a detailed circuit drawing of an alternative embodiment of the present invention.

Alternatively, the present invention may be implemented with ESD protection device 31 having an N-channel MOS transistor 85 coupled to a semiconductor controlled rectifier (SCR) circuit according to an alternative embodiment in FIG. 8. The SCR circuit in the alternative embodiment is comprised of MOS transistor 85, resistors 81 and 84, NPN bipolar transistor 83 and PNP bipolar transistor 82. Furthermore, in the alternative embodiment, control circuit 32 is comprised of MOS capacitor 86 and MOS transistors 88, 89 and 87 which correspond to MOS capacitor 42 and MOS transistors 43, 44 and 45 respectively, in FIG. 4. Refer to the above discussion for a detailed description of control circuit 32.

The SCR circuit in the alternative embodiment is triggered under certain conditions when MOS transistor 85 is activated by increasing the voltage at Node A. In FIG. 8, an input of SCR circuit at node B is coupled to a base of NPN bipolar transistor 83, which receives a substrate current generated by MOS transistor 85. Bipolar transistor 83 has an emitter coupled to one end of resistor 84 and a source of MOS transistor 85 and a collector coupled to a base of PNP bipolar transistor 82 and to a drain of MOS transistor 85 through resistor 81. Furthermore, bipolar transistor 82 has an emitter coupled to the drain of MOS transistor 85 and a collector coupled to another end of resistor 84 and to the base of bipolar transistor 83. Note that the drain of MOS transistor 85 is coupled to the first voltage conduit 90 at Vcc and the source of MOS transistor 85 is coupled to a second voltage conduit 91 at Vss.

Figure 11:
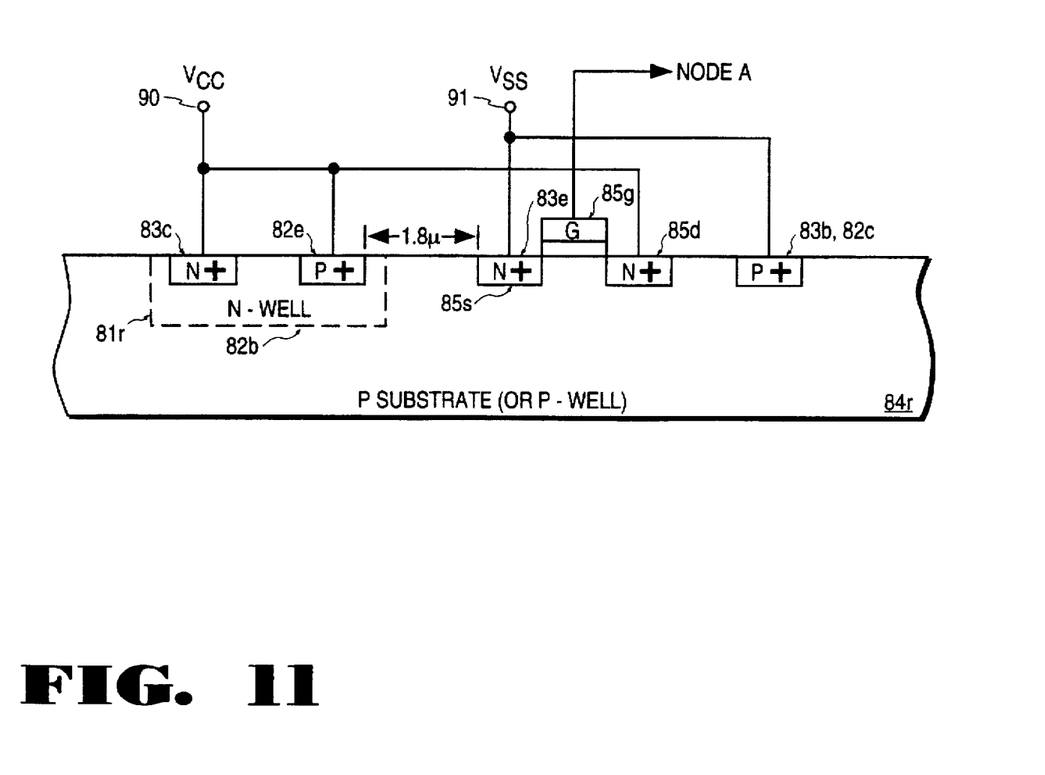
FIG. 11 illustrates a cross-sectional view of the control circuit in the alternative embodiment.

FIG. 11 illustrates a cross sectional view of the SCR circuit, interposed between voltage conduit 90, typically at Vcc and voltage conduit 91, typically at Vss. NPN bipolar transistor 83 has been implemented by N+ diffusion and/or implantation region 83c into N-well 81r and N+ diffusion and/or implantation region 83e into P-substrate 84r and P+ diffusion and/or implantation region 83b into P-substrate 84r. PNP bipolar transistor 82 has been implemented by P+ diffusion and/or implantation region 82e into N-well 82b formed in P-substrate 84r and P+ diffusion and/or implantation region 82c into P-substrate 84r. N+ terminal 83c and P+ terminal 82e are electrically connected to Vcc 90, and N+ terminal 83e and P+ terminal 83b/82c are electrically connected to Vss 91. Note that resistor 81 is the resistance in N-well 81r and resistor 84 is the resistance in P-substrate 84r.

Also illustrated in FIG. 11 is N-channel MOS transistor 85 with its gate 85g connected to terminal G at node A and its source connected to N+ diffusion and/or implantation region 85s and its drain connected to N+ diffusion and/or implantation region 85d. Note that N+ terminal 85s is electrically connected to Vss and N+ terminal 85d is electrically connected to Vcc 90. In this alternative embodiment, the W/L ratio of each MOS device 85, 86, 88, 89 and 87 is 92.7/0.7, 79.9/5.0, 5.0/0.7, 5.0/0.7 and 0.7/87.7, respectively. Furthermore, the distance between P+ region 82e and N+ region 83e (or 85s) is 1.8 microns.

As mentioned above, control circuit 32 controls node A by pulling up the voltage at node A when an ESD discharge is recognized, and by pulling down the voltage at node A after the occurrence of the ESD discharge. Once, the voltage at node A exceeds the threshold voltage $V_T$ of MOS transistor 85, MOS transistor 85 is activated and $I_D$ flows from the drain to the source of MOS transistor 85. Once $V_{DS}$ of MOS transistor 85 reaches its breakdown voltage $BV_{DS}$, it is triggered into its low impedance state (e.g. turning "on") MOS transistor 85.

Furthermore, when MOS transistor 85 is activated by increasing the voltage at Node A above the threshold voltage $V_T$ of MOS transistor 85, MOS transistor 85 injects current into a common substrate (P-substrate in this case) shared by bipolar transistor 83 and MOS transistor 85. As the electric field near the drain of MOS transistor 85 at 85d increases, the electrons near the drain at 85d gain enough energy to cause impact ionization, thereby creating electron-hole pairs. The generated electrons flow towards the drain 85d while the holes flow towards the substrate and a substrate current is manifested (see pp. 480–486 "Physics of Semiconductor Devices" by S. M. Sze (Wiley-Interscience Publication, 1981). This phenomena can be accelerated by increasing $V_{GS}$ of MOS transistor 85 at node A up to $V_{GS} \approx \frac{1}{2} V_{DS}$ and/or by increasing $V_{DS}$.

As the substrate current increases, more holes are injected into the base of NPN bipolar transistor 83 in P-substrate 84r and the voltage across P-substrate 84r and N+ region 83e increases until it is forward biased. NPN bipolar transistor 83 is activated allowing current to flow from Vcc 90 into the collector of NPN bipolar transistor 83 at N+ region 83c through N-well 81r and P+ region 83b in P-substrate 84r and out through N+ region 83e to Vss 91 thereby generating an N-well current. Once a sufficiently large amount of current flows in the collector of NPN bipolar transistor 83 at N+ region 83c, such that a voltage across N-well 81r is approximately 0.7V, PNP transistor 82 is activated such that current flows in the emitter of PNP bipolar transistor 82 at P+ region 82e into N-well 82b and P+ region 82c in P-substrate 84r thereby generating a substrate current. When, bipolar transistors 83 and 82 are activated, they behave as constant current sources with their current values determined by the voltage across region 83e and 83b, and the voltage across regions 82b and 82e, respectively. Once both NPN bipolar transistor 83 and PNP bipolar transistor 82 are activated, NPN bipolar transistor 83 and PNP bipolar transistor 82 form a loop with a current gain equal to the product $\beta_{PNP}\beta_{NPN}$, where $\beta_{PNP}$ and $\beta_{NPN}$ are the current gains for PNP bipolar transistor 82 and NPN bipolar transistor 83, respectively. If the loop gain is larger than unity, the terminal current (current flowing from the first voltage conduit), will increase rapidly leading to what is commonly know as "latch-up" causing $V_{DS}$ Of MOS transistor 85 to be clamped at approximately 1V.

Figure 9:
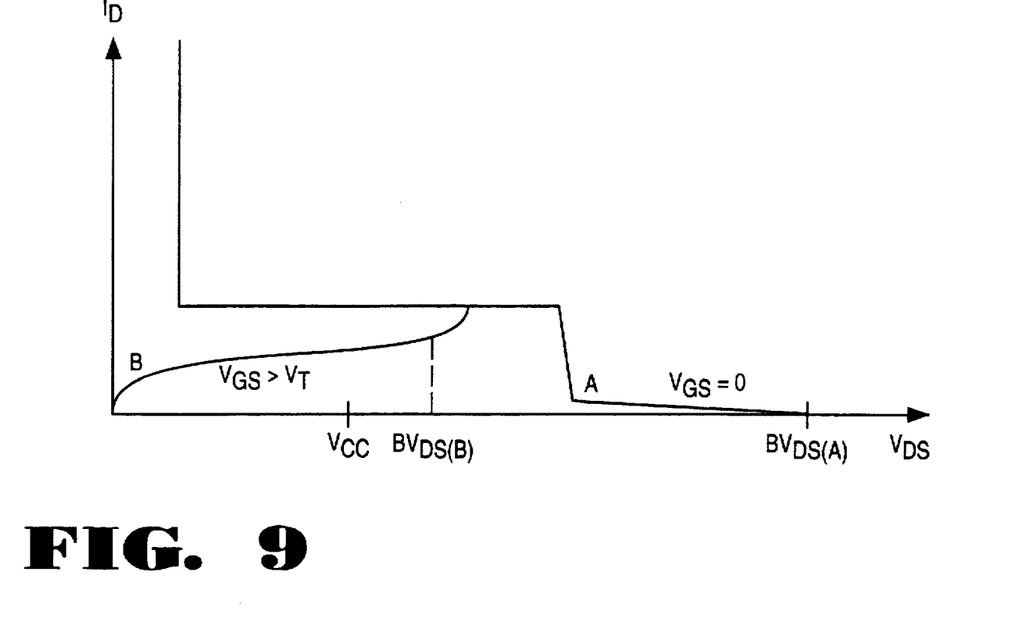
FIG. 9 illustrates the i-v characteristic curve of an N-channel MOS transistor in the alternative embodiment.

FIG. 9 illustrates the i-v characteristics of MOS transistor 85 in parallel with SCR in the alternative embodiment with the vertical axis representing the current across the drain and source, $I_D$ of MOS transistor 85 and the horizontal axis representing the voltage across the drain and source, $V_{DS}$ of MOS transistor 85. Once again, control circuit 32 controls the voltage at the gate of MOS transistor 85 located at node A. Since, ESD protection device 31 is controlled by control circuit 32, during an ESD discharge, $V_{GS}$ of MOS transistor 85 is raised above 0V such that curve B illustrates the i-v characteristics of the present invention. Note that if the gate of MOS transistor 85 is maintained at 0V, then curve A would apply, as is the case when ESD protection circuit 12 does not include control circuit 32 or when there is no ESD discharge. In this case, $V_{DS}$ reaches $BV_{DSS(A)}$ before snapping back to its low impedance state and once the SCR circuit is triggered, the ESD protection device is clamped to a lower voltage about 1V. Once again, curve A does not apply after control circuit 31 senses the ESD discharge.

The alternative embodiment follows curve B in FIG. 9 after the ESD discharge is recognized by the control circuit and $V_{GS}$ of MOS transistor 85 exceeds $V_T$ of MOS transistor 85. Since MOS transistor 85 in the alternative embodiment is coupled to the SCR circuit, once the SCR circuit latches up, $V_{DS}$ of transistor 85 is clamped to the lower voltage about 1V which is represented by the vertical portion of curve B. Once MOS transistor 85 is clamped all of the ESD current flows through the SCR circuit in the ESD protection device. Although curve B in FIG. 9 illustrates MOS transistor 85 approaching $BV_{DS}$ before MOS transistor 85 is triggered into its low impedance state, MOS transistor 85 does not have to reach its $BV_{DS}$ before current starts to flow through the SCR circuit. Whether or not MOS transistor 85 approaches it $BV_{DS}$ before triggering the SCR is dependent on the specific control circuit.

Figure 10:
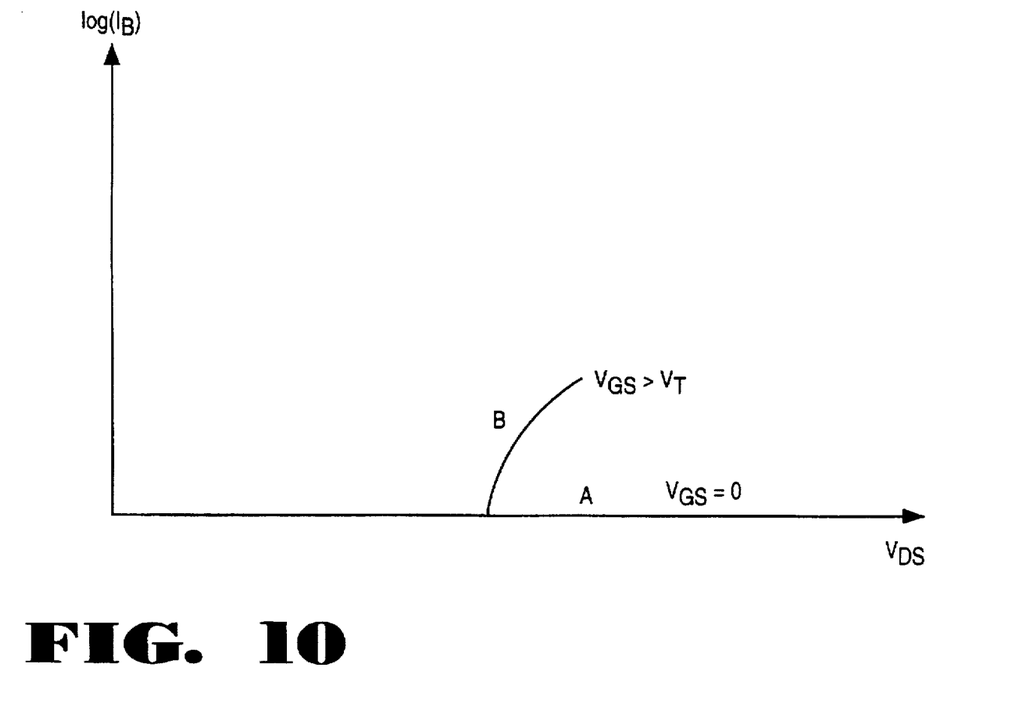
FIG. 10 illustrates a graph of the substrate current with respect to a voltage across a MOS transistor in the alternative embodiment.

According to FIG. 10 which illustrates the substrate current with respect to $V_{DS}$ of MOS transistor 85, a certain $V_{DS}$ of MOS transistor 85 must be reached before MOS transistor 85 starts injecting a significant quantity of holes into the substrate shared by the channel of MOS transistor 85 and the base of bipolar transistor 83. Furthermore, if $V_{GS}$ of MOS transistor 85 is 0V, then no current is injected into the substrate.

The advantage of clamping the voltage across MOS transistor 85 at the lower voltage is that less power is dissipated than if MOS transistor 85 was not coupled to the SCR circuit. This allows the circuit of FIG. 8 to withstand a higher voltage ESD "zap" than the circuit shown in FIG. 4. Furthermore, this allows ESD protection circuit 12 to be reduced in size.

What is claimed is:

1. An ESD protective circuit, comprising:

an ESD protection device having first, second and third terminals; and a control circuit coupled in parallel with said ESD protection device, said control circuit including a capacitive device coupled to a diode device and a pull-down device, and further including a first terminal coupled to said first terminal of said ESD protection device, a second terminal coupled to said second terminal of said ESD protection device and a third terminal coupled to said third terminal of said ESD protection device, wherein said capacitive device is coupled between said first terminal of said control circuit and said second terminal of said control circuit, said pull-down device is coupled between said second terminal of said control circuit and said third terminal of said control circuit, and said diode device is coupled between said first terminal of said control circuit and said pull-down device.

2. The ESD protective circuit of claim 1, wherein said first terminal of said ESD protection device is coupled to a first voltage conduit and said second terminal of said ESD protection device is coupled to a second voltage conduit.

3. The ESD protective circuit of claim 1 further comprising a clamping device, said clamping device is coupled between said first terminal of said control circuit and said second terminal of said control circuit.

4. The ESD protective circuit of claim 3, wherein said clamping device is an n-channel MOS transistor having a drain terminal coupled to a first terminal of said control circuit, and a gate and a source terminal coupled to said second terminal of said control circuit.

5. The ESD protective circuit of claim 1, wherein said ESD protection device provides a shunt path during an ESD discharge.

6. The ESD protective circuit of claim 5, wherein said control circuit activates said ESD protection device in response to detecting said ESD discharge.

7. The ESD protective circuit of claim 1, wherein said ESD protection device is an n-channel MOS transistor having a drain terminal coupled to said first terminal of said ESD protection device, a gate terminal coupled to said second terminal of said ESD protection device, and a source terminal coupled to said third terminal of said ESD protection device.

8. The ESD protective circuit of claim 7, wherein said control circuit modulates a voltage at said gate terminal of said n-channel MOS transistor.

9. The ESD protective circuit of claim 1, wherein said capacitive device is an n-channel MOS transistor having a gate terminal coupled to said first terminal of said control circuit, and a source and a drain terminal coupled to said second terminal of said control circuit.

10. The ESD protective circuit of claim 9, wherein said pull-down device is an n-channel MOS transistor having a drain terminal coupled to said second terminal of said control circuit, a source terminal coupled to said third terminal of said control circuit, and a gate terminal.

11. The ESD protective circuit of claim 10, wherein said diode device is an n-channel MOS transistor having a drain and a gate terminal coupled to said first terminal of said control circuit, and a source terminal coupled to said gate terminal of said pull-down device.

12. An ESD protective circuit, comprising:
an ESD protection device having first, second and third terminals; and
a control circuit coupled in parallel with said ESD protection device, said control circuit including a capacitive device coupled to a diode device and a pull-down device, and further including a first terminal coupled to said first terminal of said ESD protection device, a second terminal coupled to said second terminal of said ESD protection device and a third terminal coupled to said third terminal of said ESD protection device; and
a semiconductor controlled rectifier circuit coupled to said ESD protection device.

13. The ESD protective circuit of claim 12 wherein said semiconductor controlled rectifier circuit is activated in response to a voltage at said second terminal of said ESD protection device.

14. The ESD protective circuit of claim 12, wherein a first terminal of said semiconductor controlled rectifier circuit is coupled to said first terminal of said ESD protection device and a second terminal of said semiconductor controlled rectifier circuit is coupled to said third terminal of said ESD protection device.

15. The ESD protective circuit of claim 14, wherein said semiconductor controlled rectifier further comprises a first resistor, a second resistor, a PNP bipolar transistor, and an NPN bipolar transistor, said NPN bipolar transistor having an emitter coupled to said third terminal of said ESD protection device and a collector coupled to a base of said PNP bipolar transistor and said first terminal of said ESD protection device through said first resistor, said PNP bipolar transistor having an emitter coupled to said first terminal of said ESD protection device and a collector coupled to a base of said NPN bipolar transistor and to said third terminal of said ESD protection device through said second resistor.

* * * * *